(12) United States Patent
Toporski

(10) Patent No.: US 6,980,769 B2
(45) Date of Patent: Dec. 27, 2005

(54) METHOD FOR DETERMINING THE VALIDITY OF A RADIO STATION LOOKUP TABLE

(75) Inventor: Todd A. Toporski, Northville, MI (US)

(73) Assignee: Visteon Global Technologies, Inc., Van Buren Township, MI (US)

(*) Notice: Subject to any disclaimer, the term of this patent is extended or adjusted under 35 U.S.C. 154(b) by 252 days.

(21) Appl. No.: 10/441,897

(22) Filed: May 19, 2003

(65) Prior Publication Data

US 2004/0235486 A1 Nov. 25, 2004

(51) Int. Cl.[7] .............................................. H04H 1/00
(52) U.S. Cl. ................. 455/3.01; 455/3.02; 455/179.1; 455/185.1; 455/71; 455/186.1; 455/150.1; 370/329; 370/328; 370/338
(58) Field of Search ................................ 370/343, 329, 370/328, 338; 381/1–2; 455/42, 93, 110, 455/205, 3.01, 3.02, 179.1, 185.1, 71, 186.1, 455/150.1

(56) References Cited

U.S. PATENT DOCUMENTS

| | | | |
|---|---|---|---|
| 5,584,051 A | * | 12/1996 | Goken ........................ 455/68 |
| 5,689,822 A | * | 11/1997 | Zucker ....................... 455/337 |
| 5,740,035 A | * | 4/1998 | Cohen et al. ................. 705/10 |
| 5,907,793 A | * | 5/1999 | Reams ........................ 725/122 |
| 5,950,123 A | * | 9/1999 | Schwelb et al. .......... 455/414.4 |
| 6,112,063 A | * | 8/2000 | Ravi et al. ................ 455/186.1 |
| 6,246,672 B1 | | 6/2001 | Lumelsky |
| 6,741,834 B1 | * | 5/2004 | Godwin ..................... 455/3.01 |
| 6,822,953 B1 | * | 11/2004 | Schaefer et al. ........... 370/344 |
| 6,829,475 B1 | * | 12/2004 | Lee et al. ................... 455/419 |
| 2003/0186662 A1 | * | 10/2003 | Himmel et al. .......... 455/185.1 |
| 2004/0110522 A1 | * | 6/2004 | Howard et al. ............. 455/512 |

FOREIGN PATENT DOCUMENTS

| | | |
|---|---|---|
| EP | 0946011 | 9/1999 |
| EP | 0961431 | 12/1999 |
| EP | 1022873 | 7/2000 |

* cited by examiner

Primary Examiner—Sonny Trinh
Assistant Examiner—Khai Nguyen
(74) Attorney, Agent, or Firm—MacMillan, Sobanski & Todd LLC

(57) ABSTRACT

The continuing validity of a lookup table in a radio receiver for tuning to digital audio stations is monitored. The radio receiver is tuned to a first designated frequency. A determination is made whether a station identification code is identified in a digital broadcast signal at the first designated frequency matches the designated station identification code in the table entry. The radio receiver is tuned to a next designated frequency. A determination is made whether a next station identification code identified in a next digital broadcast signal at the next designated frequency matches the next designated identification code in a next table entry. A determination is made whether an invalid table condition occurs wherein the invalid table condition is a predetermined number of non-matches from the determining steps. A message is displayed that the lookup table is invalid when the invalid table condition occurs.

16 Claims, 5 Drawing Sheets

| Station Index | Broadcast Type | Station Location | Station Call Letter | Station Alias | Genre | Program Format |
|---|---|---|---|---|---|---|
| 1 Byte | 2 Bits | 4 Bytes | 2 Bytes | 2 Bytes | 1 Bytes | 1 Bit |

METHOD FOR DETERMINING THE VALIDITY OF A RADIO STATION LOOKUP TABLE

CROSS REFERENCE TO RELATED APPLICATIONS

Not Applicable.

STATEMENT REGARDING FEDERALLY SPONSORED RESEARCH

Not Applicable.

BACKGROUND OF THE INVENTION

1. Field of the Invention

The present invention relates in general to digital audio broadcasting, and more specifically, to a method for determining the validity of a lookup table in a radio receiver.

2. Description of the Related Art

With the introduction of digital audio broadcasting, a radio listener has the opportunity to experience a higher quality of broadcast reception utilizing a digital broadcast as opposed to a traditional analog broadcast. Improved reception, better audio quality, and data services are some of the benefits of using digital audio broadcasting.

A duplicative audio broadcast system simultaneously transmits 1) a primary channel having at least a main program content and preferably including a supplemental data stream, and 2) a backup channel with main program content that is at least a partial duplicate of the main program content in the primary channel but usually without the supplemental data stream. Certain differences in the backup channel transmission allow it to be received by a receiver under conditions in which the primary channel is unreceivable.

To receive the full benefits of digital audio broadcasting, listeners must have a digital audio receiver to receive the digital audio broadcast, therefore there will be a transition period as listeners migrate from analog audio receivers to digital audio receivers. During the transition period, if a broadcast station wants to maintain their listening audience, the broadcast station must transmit both a digital broadcast for those listeners who are capable of receiving the digital broadcast and transmit an analog broadcast for those listeners who are still utilizing the analog audio receiver.

A method of broadcasting both the digital signal and the analog signal over a frequency range for a particular audio broadcast station has recently become available. In-Band On Channel (IBOC) is a system that has been adapted to transmit a hybrid signal. IBOC transmits the analog signal on a center portion of the frequency range with the digital signal occupying an upper and lower side portion of the frequency range.

Eventually, hybrid stations may transition to an all digital audio broadcast station while retaining the duplicative nature of the broadcast signal (i.e. both the primary and backup channels are digital). In the all digital duplicative system, the backup channel transmits at a lower effective data rate in order to provide a more robust signal that can be received during times that (or at a place where) the primary channel is impaired. In order to achieve a lower data rate, the supplemental data and possibly some portion of the main program content are omitted from the backup channel (e.g., by encoding the main audio program at a lower bit rate).

An advantage with digital audio broadcasting is that the digital signal contains auxiliary program data, station identification information, or other information in addition to digital audio. The station identification information and auxiliary program data is useful in informing the listener as to the content of the broadcast signal without having to wait to listen to a received broadcast to determine the contents thereafter. The digital signal contains, in part, a plurality of subcarriers each containing digital information representative of program data transmitted by the IBOC station. Information such as station identification (e.g. call letters), song title, artist, genre, and album are some of the information that can be quickly referenced by the listener. However, decoding and outputting the digital signal to the listener may be more timely than decoding and outputting the analog signal due to the complex decoding that is performed on audio and data subcarriers of the digital signal.

A lookup table may be used to quickly obtain information on a broadcast station without having to first receive the information. The lookup table would contain station related information regarding a specific broadcast station such as station identification, genre, broadcast type, station location, station alias name, program format, and other related information that is not dependent upon a song selection currently being broadcast by the IBOC station. The lookup table would be constructed for a respective broadcast region that the receiver has been updated for. The frequency range or channel of the broadcast is used to index the lookup table to retrieve and display the station related information without having to decode the digital signal. A lookup table can be constructed or rebuilt automatically by the receiver or manually by a listener. An example of how the lookup table could be rebuilt is by using a scan function. Once initiated the receiver will scan through a broadcast band looking for digital audio broadcast stations transmitting a digital signal. When the receiver determines that a frequency range or channel is broadcasting a digital signal, the receiver will store the station related information for the digital audio broadcast station at a table entry in the lookup table. Each table entry in the lookup table will be associated with a respective frequency range or channel of a respective digital audio broadcast station. Due to the length of time required for such a full scan, however, it should only be performed infrequently or else a second tuner should be present.

However, if a listener travels out of the broadcast region and is no longer able to receive the IBOC station for the respective broadcast region, the lookup table is no longer valid and gives erroneous data if a second digital station is broadcasting on the same channel in the new geographical region. Furthermore, the listener unaware that the new geographical region has been entered would receive no notification that such an event has taken place and that the lookup table currently stored in memory is invalid.

It would be desirable to provide a method for determining whether a lookup table containing digital audio broadcast information is invalid for a broadcast region so that a receiver does not rely on erroneous data and can notify a listener that the lookup table needs to be rebuilt. Such a method that automatically tracks and verifies the validity of a lookup table would overcome such disadvantages.

SUMMARY OF THE INVENTION

Consonant with the present invention, a lookup table in a radio receiver comprises station identification and programming information relating to a plurality of digital audio broadcast stations for a geographical region. The invention has the advantage of determining whether the lookup table has erroneous data for the geographical region the radio receiver is currently receiving digital broadcast signals from and to notify a listener that the lookup table needs to be rebuilt by the listener or the receiver can automatically rebuild the lookup table.

In one aspect of the invention, a method comprises the steps of determining a validity of a lookup table in a radio receiver. The radio receiver is tuned to a first designated frequency. A determination is made whether a station identification code is identified in a digital broadcast signal at the first designated frequency matches the designated station identification code in the table entry. The radio receiver is tuned to a next designated frequency. A determination is made whether a next station identification code identified in a next digital broadcast signal at the next designated frequency matches the next designated identification code in a next table entry. A determination is made whether an invalid table condition occurs wherein the invalid table condition is a predetermined number of non-matches from the determining steps. A message is displayed that the lookup table is invalid when the invalid table condition occurs.

DETAILED DESCRIPTION OF PREFERRED EMBODIMENTS

Figure 1:
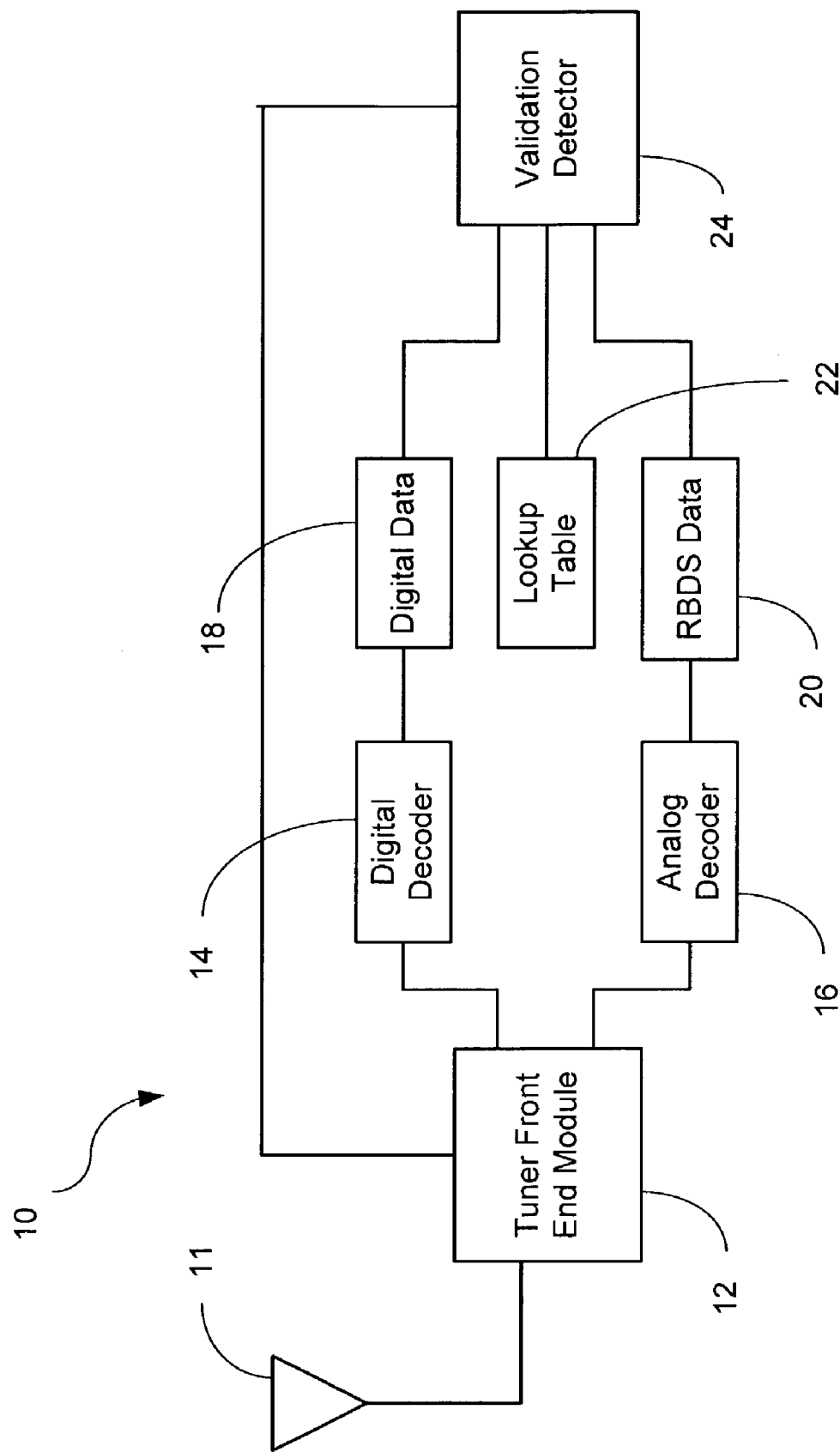
FIG. 1 is a block diagram of a receiver for determining the validity of a lookup table.

Referring now to the Drawings and particularly to FIG. 1, there is shown a block diagram of a receiver used to receive an incoming audio broadcast signal and to verify a validity of a lookup table according to the present invention. A receiver 10 comprises an antenna 11 for receiving a digital audio broadcast signal, such as an IBOC signal, from a digital audio broadcast station. The IBOC signal comprises a primary data signal (e.g. digital signal) and a backup data signal (e.g. analog signal) both including a main audio program signal over a frequency range for a particular digital audio broadcast station. The analog signal is transmitted on a center band of the frequency range while the digital signal occupies upper and lower sideband portions of the frequency range. The antenna 11 is connected to an input of a tuner front end module 12 capable of selecting a frequency range broadcasting of the IBOC signal. The tuner front end module 12 includes a local oscillator, a mixer for mixing received audio broadcast signal with the local oscillator, a bandpass filter and an analog to digital converter. One or more tuners may be used to process the analog and digital signal over the frequency range.

A digital demodulator/decoder 14 is connected to the tuner front end module 12 for providing the digital signal containing a digital data 18. The digital data 18 includes identification codes relating to the station and programming content of the digital audio broadcast station as well as the audio signal. Identification codes relating to the station and programming content of the digital audio broadcast station may be included in the analog signal by using Radio Broadcast Data System (RBDS) technology. RBDS uses various codes and features such as PTY (Program Type), PTYN (Program Type Name), PI (Program Identification), and PS (Program Service) to provide information concerning station and programming content of the analog signal. An RBDS data in the form of the PTY, PTYN, or other codes can be transmitted in the analog signal to indicate that the digital audio broadcast station provides the IBOC signal. An analog demodulator/decoder 16 is connected to the tuner front end module 12 for providing an analog signal containing the RBDS data 20. The analog signal includes the audio signal and may also include the RBDS data 20 which contains the identification codes relating to the station and programming content of the digital audio broadcast station. Alternatively, the backup signal can be a second digital signal transmitting at a slower effective data rate by omitting supplemental data and possibly some portion of a main program content.

A lookup table 22 is used to store the station identification codes and other programming related to a plurality of digital audio broadcast stations for a geographical location. The station identification codes are associated with a designated audio broadcast station for a designated geographical location. The lookup table is valid within a geographical region within the coverage of the represented broadcast stations. When traveling outside of the geographical region the lookup table can become invalid and will need to be updated. Updating can occur automatically or manually by prompting the listener to perform an update function. The lookup table 22 is connected to a validation detector 24. In the preferred embodiment, the validation detector is a microcontroller. The digital data and the RBDS data are also connected to the validation detector 24. The identification codes of the lookup table 22 are compared with the identification codes contained in the RBDS data 20 or the digital data 18 to determine if a match is present. The validation detector 24 contains parameters to determine if an invalid lookup table condition exists for the designated geographical region based on a number of non-matching comparisons between the identification codes of the lookup table 22 and the audio broadcast signal 12.

Figures 2A, 2B:
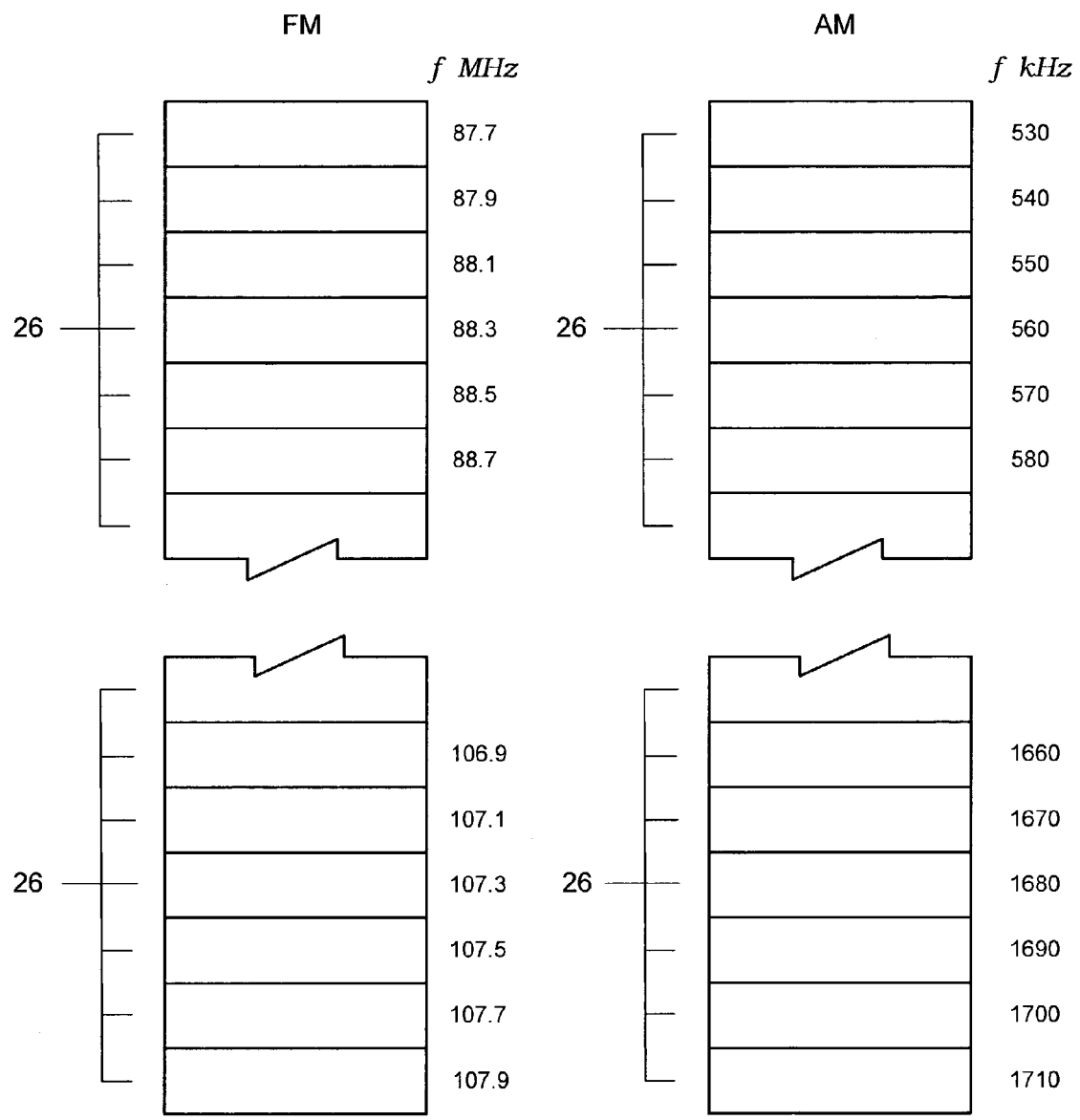
FIG. 2a is a lookup table for a FM broadcast band.
FIG. 2b is a lookup table for an AM broadcast band.

FIGS. 2a and 2b illustrates a lookup table for a broadcast band of a designated geographical location. FIG. 2a represents the lookup table for the broadcast band for frequencies allocated to a FM band and FIG. 2b represents the lookup table for the broadcast band for frequencies allocated to an AM band. The FM band ranges from frequencies 87.7 MHz–107.9 MHz. For the FM band, there are 101 allocated broadcast channels. The AM band ranges from frequencies 530 kHz–1710 kHz. For the AM band, there are 118 allocated broadcast channels. The lookup table is constructed with a plurality of table entries to accommodate all audio broadcast stations broadcasting at a designated frequency in either the FM band or AM band for a designated geographical location (e.g. the location of a motor vehicle containing the radio receiver). Table entries 26 contain identification codes relating to the station or programming content for each broadcast station and are indexed according to their allocated channel frequency. The identification codes represent a plurality of searchable information items relating to the station or programming content such as station identifiers, music genre, program formats (music or talk), special station services and many other useful types of information. The lookup table is stored in non-volatile memory, such as flash or battery-backed static ram (SRAM). Following a receiver power-up, the lookup table is loaded into scratch RAM where the lookup table may be updated at any time during the receiver operation. The table is only updated with local broadcasting stations. When the receiver is powered down or in standby mode, the updated data in the scratch RAM is written to the non-volatile memory locations.

In the preferred embodiment, the number of table entries remains fixed for the FM broadcast band and AM broadcast band. As a result, if the receiver is mobile, the number of table entries do not change. Only the identification codes for each table entry 26 changes as the duplicative audio broadcast signal is lost when leaving a designated geographical location and a new broadcast audio signal is received for a new designated geographical location. Updating may be performed with or without the listener's awareness. Alternatively, to reduce the amount of memory needed to accommodate the number of table entries for the designated geographical location, a variable amount of memory can be allocated to account for only the number of audio broadcast stations broadcasting in the designated geographical location.

Figure 3:
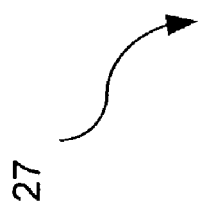
FIG. 3 is a table entry in a lookup table illustrating identification codes associated with a station and programming content of a digital audio broadcast signal.

FIG. 3 illustrates one table entry 27 in the lookup table 22. The table entry 27 contains identification codes regarding detailed information about the station and programming content of the digital audio signal 12. The table entry 27 containing identification codes is stored for each digital audio broadcast station contained in the lookup table 22 for the designated geographical location. Identification codes such as station index, type of broadcast (all-digital, all-analog, hybrid), station location, station identification code, alias name, genre, and program format are only some of the identification codes that can be stored in a table entry. Each of the identification codes would be restricted to a set memory size based on the available memory of the receiver.

Figure 4:
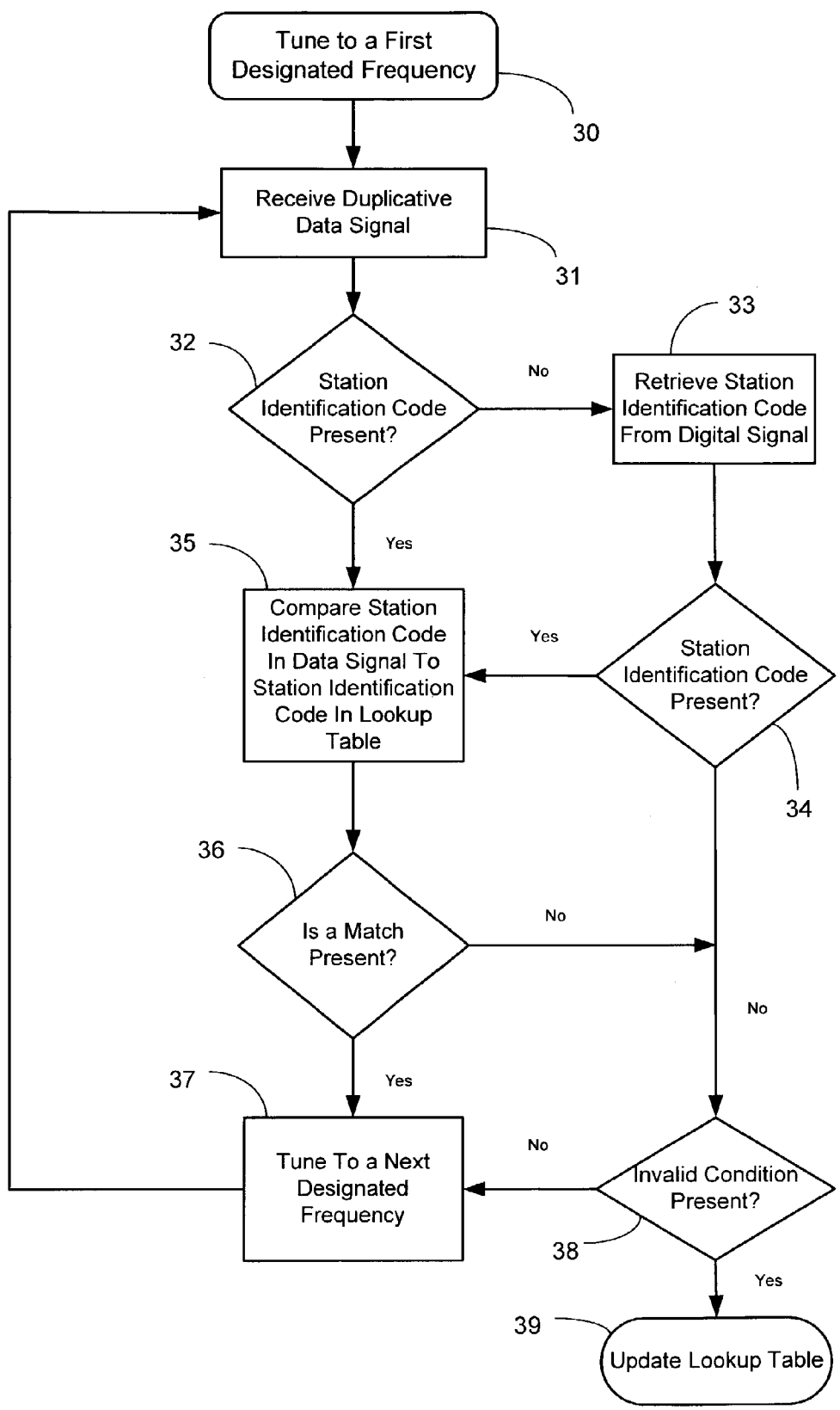
FIG. 4 is a flow diagram of a method to determine the validity of a lookup table according to a first preferred embodiment.

FIG. 4 illustrates a flowchart of the validation detection for a first preferred embodiment. In step 30, a listener performs a tune operation to the frequency of the digital audio broadcast station broadcasting the audio broadcast signal. A tune operation includes any type of method used to select the frequency of the digital audio broadcast station such as seek functions, scan function, preset memory, or incrementing frequencies in the broadcast band. In step 31, the receiver selects a frequency providing the duplicative audio broadcast signal such as an IBOC signal. The audio broadcast signal contains at least one of the identification codes relating to the digital audio broadcast station, such as a station identification code. Alternatively, any of the identification codes listed in the table entry that identifies a digital audio broadcast station can be utilized in place of the station identification code. Step 32 determines if the analog data signal contains the station identification code. If the station identification code is retrieved in step 32, a comparison is made to determine if the station identification code of the analog data signal matches the station identification code of the lookup table in step 35. If a match is present, the receiver waits until a next tune operation is performed to determine if a match is present for a next frequency in step 37. If the station identification code is not retrieved in step 32, then an attempt to retrieve the station identification code is made in step 33. If a determination is made that station identification is retrieved from the digital data signal in step 34, then a comparison is made to determine if the station identification code of the digital data signal matches the station identification code of the lookup table in step 35. If a match is not present in step 36, then a check is performed to determine if an invalid condition is present in step 38. Likewise, in step 34, if a station identification code is not retrieved, then a determination is made to verify if an invalid condition is present in step 38. If the invalid condition is present, then the lookup table is either updated automatically for the new geographical region or the listener may be alerted that the lookup table contains erroneous data for a current geographical region currently receiving the duplicative audio broadcast signal and can manually update the lookup table in step 39. If the invalid condition is not present, then the listener tunes the receiver to a next designated frequency in step 37 and a return to step 31 is performed to determine validity of the lookup table.

Figure 5:
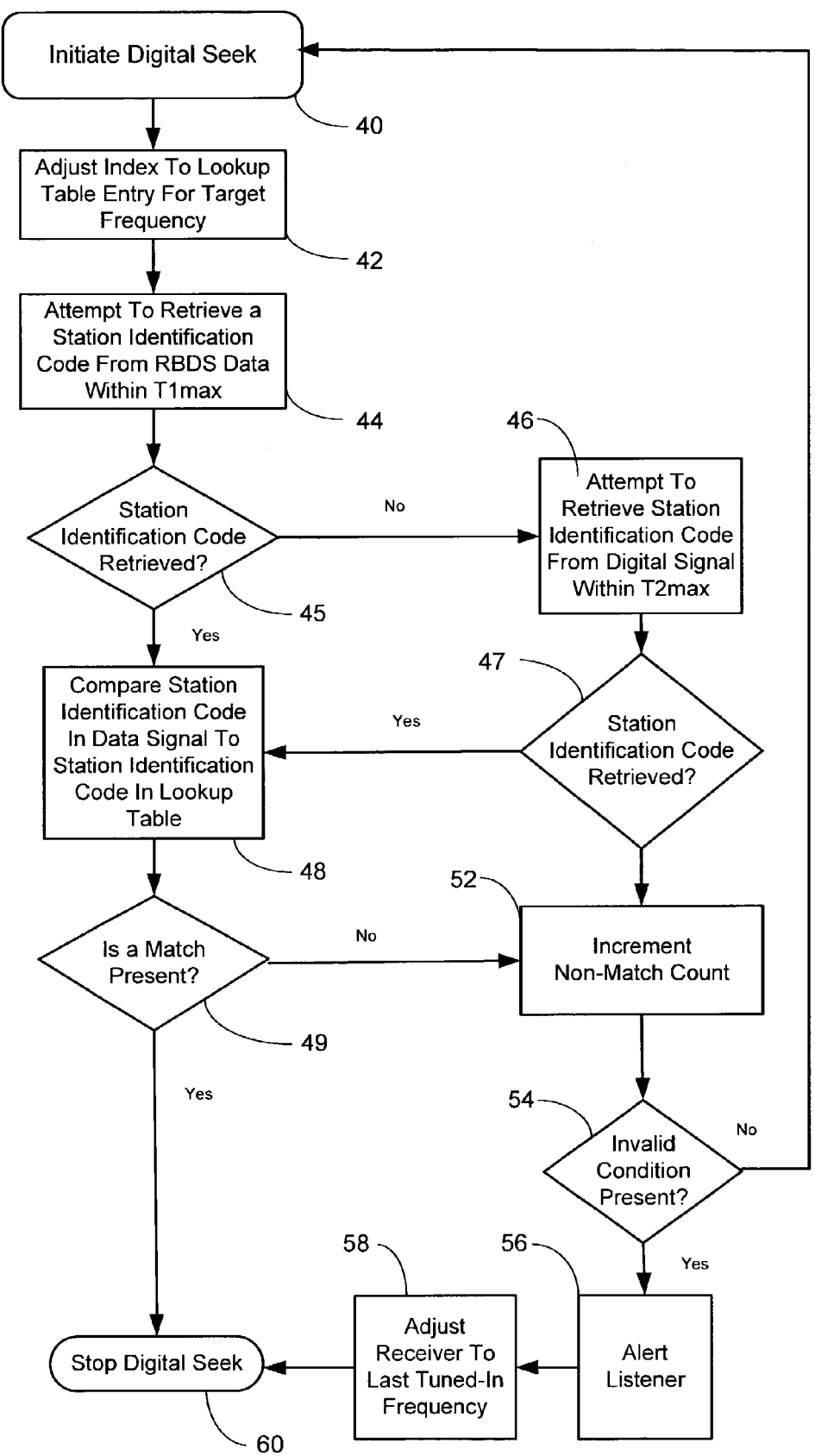
FIG. 5 is a flow diagram of a method to determine the validity of a lookup table according to a second preferred embodiment.

FIG. 5 illustrates a flowchart of the validation program for a second preferred embodiment. In step 40, a digital seek command is initiated. The digital seek command includes any adjustment of the frequency of the receiver which attempts to obtain a digital audio broadcast signal while bypassing any analog only broadcasts. This includes a tune function, scan function, memory preset, or a seek function. In step 42, an index is adjusted to the table entry associated with the frequency that the receiver has been adjusted to. In step 44, an attempt to retrieve the identification code (such as a station identification code using call letters) from the RBDS data of the analog signal is attempted for a first predetermined period of time. A determination of whether the identification code was retrieved within a first predetermined period of time is made in step 45. If the first predetermined period of time has elapsed without receiving the identification code, an attempt to retrieve the identification code from the digital data within a second predetermined period of time is initiated in step 46. A determination of whether the identification code was retrieved from the digital data within a second predetermined period of time is made in step 47. If the identification code has not been retrieved within the second predetermined period of time in step 47, then a non-match count is incremented in step 52. In step 48, if a determination is made in step 45 or in step 47 that the identification code is retrieved, a comparison of the identification code of the table entry and the identification signal retrieved from the audio broadcast signal is performed to determine if a match is present in step 48. If a match is determined to be present in step 49, then the digital seek is terminated in step 60. If a non-match is determined in step 49, then a non-match count is incremented in 52. In step 54, a determination of whether a non-validation condition is present is performed by comparing the non-match count with the non-validation condition. The non-validation condition is determined in response to a predetermined number of non-matches. The non-validation condition could be set to a number of consecutive non-matches, a number of nonconsecutive non-matches, or a number of non-matches in relation to a number of matches. If a non-validation condition is present, a message is displayed to the listener that the lookup table is invalid in step 56. The message could be a text display, an audible message, or a visual display. In step 58, the receiver is adjusted to a last in-tune frequency and the digital seek is terminated as in step 60. If the determination is made in step 54 that a non-validation condition is not present, then a return to step 40 is performed to continue the digital seek.

From the foregoing description, one ordinarily skilled in the art can easily ascertain the essential characteristics of this invention and, without departing from the spirit and scope thereof, can make various changes and modifications to the invention to adapt it to various usages and conditions.

What is claimed is:

1. A method of determining a validity of a lookup table in a radio receiver, said lookup table including table entries for respective digital audio broadcast stations of a broadcast band transmitting to a geographical location, each table entry containing a respective station identification code and content-related information for presentation to a listener, said respective digital audio broadcast stations broadcasting a duplicative audio broadcast signal containing both a primary and a backup signal allocated over a frequency range of each of said respective digital audio broadcast stations, said backup signal containing a data signal providing said station identification code for said respective digital audio broadcast stations, said method comprising the steps of:

tuning to a first designated frequency;

receiving the backup data signal to determine a station identification code of a received station;

if said backup data signal did not contain said station identification code, then receiving the primary data signal to determine the station identification code of said received station;

comparing said station identification code of said received station with said station identification code in a table entry corresponding to said first designated frequency;

tuning to a next designated frequency of a next received station; receiving a next backup data signal to determine a next station identification code of said next received station;

if said next backup data signal did not contain said next station identification code, then receiving a next primary data signal to determine said next station identification code of said next received station;

comparing said next station identification code of said next received station with said next station identification code in said next table entry corresponding to said next designated frequency;

detecting an invalid table condition in response to a non-matching number of comparisons.

2. The method of claim 1 wherein said detecting step further includes displaying message that said lookup table is invalid in response to said invalid table condition.

3. The method of claim 2 wherein said displaying step is comprised of a text display.

4. The method of claim 2 wherein said displaying step is comprised of audible message.

5. The method of claim 2 wherein said displaying a message is a visual display.

6. The method of claim 1 wherein said displaying step further comprises prompting a listener to perform a function to create a new lookup table.

7. The method of claim 1 wherein said invalid table condition is a predetermined number of consecutive non-matches from said determining steps.

8. The method of claim 1 wherein said invalid table condition is a predetermined number of nonconsecutive non-matches from said determining steps.

9. The method of claim 1 wherein said non-validation condition is a predetermined number of non-matches in relation to a predetermined number of matches from said determining steps.

10. The method of claim 1 wherein said receiving the backup data steps are performed within a first predetermined period of time.

11. The method of claim 1 wherein said receiving the primary data steps are performed within a second predetermined period of time.

12. The method of claim 1 wherein said station identification code comprises call characters identifying said duplicative digital audio broadcast station.

13. The method of claim 1 wherein said primary data signal is a digital signal.

14. The method of claim 1 wherein said backup data signal is an analog signal.

15. The method of claim 14 wherein said analog data signal is an RBDS signal.

16. The method of claim 1 wherein said backup data signal is a second digital signal.

* * * * *